(12) United States Patent
Chiou et al.

(10) Patent No.: US 12,374,655 B2
(45) Date of Patent: Jul. 29, 2025

(54) METHOD OF FORMING PACKAGE STRUCTURE BY USING A WAFER CHUCK WITH ADJUSTABLE CURVED SURFACE

(71) Applicant: Taiwan Semiconductor Manufacturing Company, Ltd., Hsinchu (TW)

(72) Inventors: Wen-Chih Chiou, Miaoli County (TW); Yung-Chi Lin, New Taipei (TW); Yen-Ming Chen, Hsin-Chu County (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 510 days.

(21) Appl. No.: 17/838,292

(22) Filed: Jun. 13, 2022

(65) Prior Publication Data
US 2023/0402428 A1    Dec. 14, 2023

(51) Int. Cl.
*H01L 23/00* (2006.01)
*H01L 21/48* (2006.01)
*H01L 21/56* (2006.01)

(52) U.S. Cl.
CPC .......... *H01L 24/96* (2013.01); *H01L 21/4857* (2013.01); *H01L 21/561* (2013.01); *H01L 2224/951* (2013.01)

(58) Field of Classification Search
CPC .......... H01L 27/0922; H01L 21/0259; H01L 21/823807; H01L 21/823814; H01L 21/823878; H01L 29/0665; H01L 29/42392; H01L 29/66545; H01L 29/66742; H01L 29/78618; H01L 29/78696; H01L 29/20; H01L 29/66469; H01L 21/8221; H01L 27/092; H01L 29/0673; H01L 29/66439; H01L 29/775; H01L 27/0688; B82Y 10/00
See application file for complete search history.

(56) References Cited

U.S. PATENT DOCUMENTS

| 6,025,099 | A  | * | 2/2000  | Slonaker | G03F 7/703 430/311 |
| 2010/0248446 | A1 | * | 9/2010  | Liu | H01L 21/6838 269/21 |
| 2019/0333871 | A1 | * | 10/2019 | Chen | H01L 23/5384 |

OTHER PUBLICATIONS

Park, You-Jin, Gilseung Ahn, and Sun Hur. "Optimization of Pick-and-Place in Die Attach Process." (2016). (Year: 2016).*
Workman, Thomas, et al. "Die to wafer hybrid bonding and fine pitch considerations." 2021 IEEE 71st electronic components and technology conference (ECTC). IEEE, 2021. (Year: 2021).*

* cited by examiner

*Primary Examiner* — Norman D Richards
*Assistant Examiner* — Ethan Edward Cutler
(74) *Attorney, Agent, or Firm* — JCIPRNET

(57) ABSTRACT

A method includes attaching a wafer to a wafer chuck having a curved surface. The method further includes placing a device die on the wafer, such that a first dielectric layer of the device die is in contact with a second dielectric layer of the wafer, and performing an annealing process to bond the first dielectric layer to the second dielectric layer. The method further includes encapsulating the device die with an encapsulating material, forming redistribution lines overlapping the encapsulating material and the device die, and sawing the encapsulating material to form a plurality of packages.

20 Claims, 9 Drawing Sheets

METHOD OF FORMING PACKAGE STRUCTURE BY USING A WAFER CHUCK WITH ADJUSTABLE CURVED SURFACE

BACKGROUND

The packages of integrated circuits are becoming increasing complex, with more component dies integrated in the same package to achieve more functions. For example, System-on-Integrated-Chips (SoIC) have been developed to include a plurality of component dies such as processors and memory cubes in the same package. The SoIC can bond component dies formed using different technologies and have different functions to the same component die, thus forming a system. This may save manufacturing cost and optimize device performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
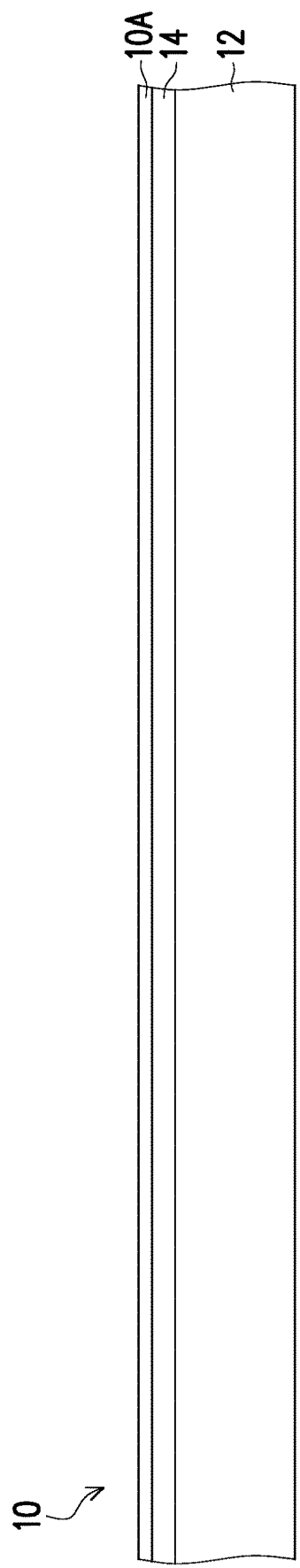
FIG. 1A to FIG. 1E are cross-sectional views of intermediate stages in the formation of a package in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1A to 1E are cross-sectional views of intermediate stages in the formation of a package in accordance with some embodiments. Referring to FIG. 1A, a wafer 10 is provided. In some embodiments, the wafer 10 includes a semiconductor wafer (such as a silicon wafer), a portion of a semiconductor wafer, a dielectric wafer (such as a glass wafer), a portion of a dielectric wafer, another suitable substrate, or a combination thereof. The wafer 10 may contain device elements such as active devices and/or passive devices. In some other embodiments, the wafer 10 does not contain any device element. For example, the wafer 10 is a blank silicon wafer.

In some embodiments, the wafer 10 includes a semiconductor substrate 12 and an interconnection structure 14 formed on the semiconductor substrate 12, as shown in FIG. 1A. The interconnection structure 14 includes an interlayer dielectric layer and multiple conductive contacts, conductive vias, and conductive lines formed in the interlayer dielectric layer.

In some embodiments, a dielectric layer 10A may be formed on the interconnection structure 14. The dielectric layer 10A may serve as a bonding layer to facilitate a subsequent bonding with the device die 20 (through, for example a fusion bonding process). In these cases, the dielectric layer 10A has a subsequent planar top surface. A planarization process, such as a chemical mechanical polishing (CMP) process, may be used to provide the dielectric layer 10A with the substantially planar top surface. In some embodiments, the dielectric layer 10A may be a sub-layer of the interlayer dielectric layer of the interconnection structure 14. In some other embodiments, the wafer may include bond pads in the dielectric layer 10A, and the top surfaces of the bond pads may be substantially coplanar with the top surface of the dielectric layer 10A.

Figure 1B:
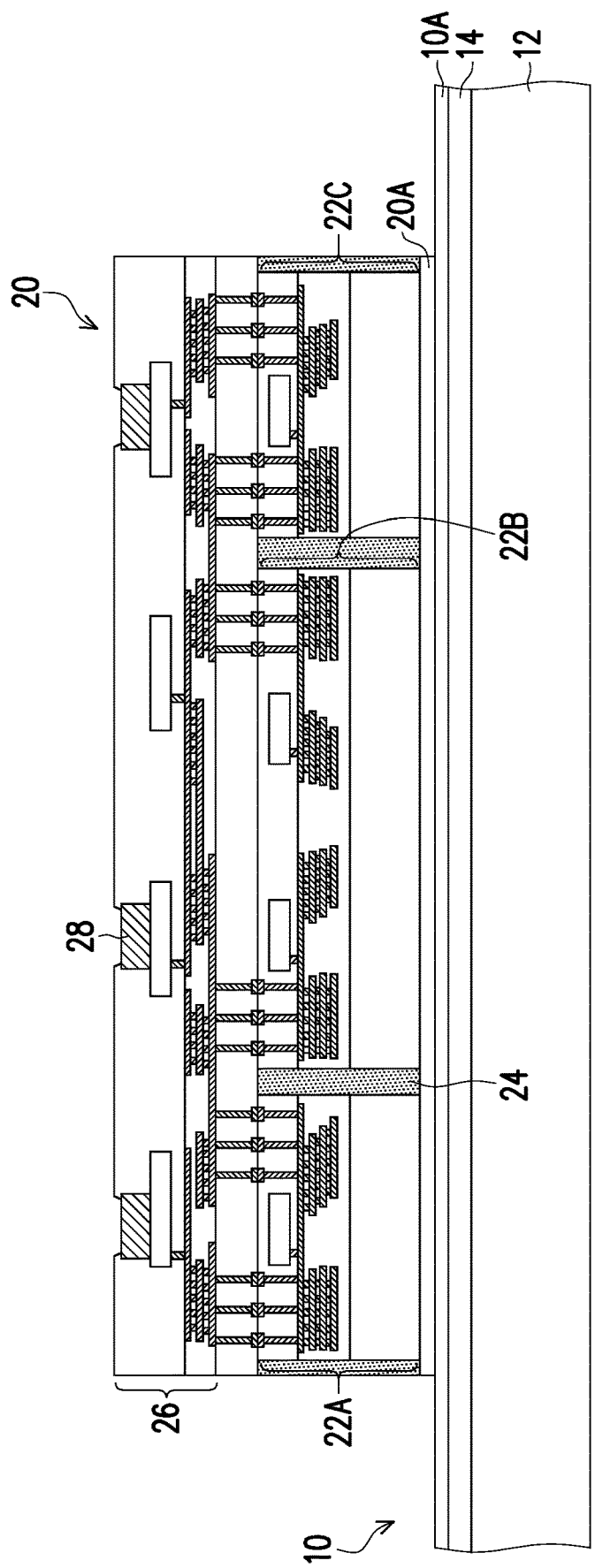

Referring to FIG. 1B, discrete device dies 20 are placed on the wafer 10. In some embodiments, multiple discrete device dies 20 may be placed on the wafer 10, for example, through a pick and place process. As shown in FIG. 1B, the device die 20 includes stacked dies 22A, 22B, and 22C and an encapsulant 24 encapsulating the dies 22A, 22B, and 22C.

In accordance with some embodiments of the present disclosure, each of the dies 22A, 22B, and 22C may be a Central Processing Unit (CPU) die, a Micro Control Unit (MCU) die, an input-output (ID) die, a Base Band (BB) die, an Application processor (AP) die, or the like. Dies 22A, 22B, and 22C may also include memory dies. In addition, the dies 22A, 22B, and 22C may be different types of dies selected from the above-listed types. The dies 22A, 22B, and 22C may be formed using different technologies such as nm technology, 28 nm technology, 20 nm technology, or the like. Also, one of the dies 22A, 22B, and 22C may be a digital circuit die, while the other may be an analog circuit die. The dies 22A, 22B, and 22C in combination function as a system. Splitting the functions and circuits of a system into different dies such as the dies 22A, 22B, and 22C may optimize the formation of these dies, and may achieve the reduction of manufacturing cost.

In some embodiments, the device die 20 may be a System-on-Integrated-Chips (SoIC). The device die 20 may further include an interposer 26 over and bonded with the dies 22A, 22B, and 22C. FIG. 1B shows the dies 22A, 22B, and 22C being horizontally allocated at a same level. However, in some other embodiments, the dies may be vertically stacked. In some other embodiments, a device die may include more or less dies. The device die 20 may include a dielectric layer 20A at the illustrated bottom surface of the device die 20. The dielectric layer 20A may have a subsequent planar bottom surface. In some embodiments, the device die 20 may also include bond pads (not shown) in the dielectric layer 20A, and the bottom surfaces of bond pads are coplanar with the bottom surface of dielectric layer 20A. In FIG. 1B, the device die 20 is shown "face up", however, in some alternative embodiments, the device die may be bonded "face down" to the wafer.

As shown in FIG. 1B, after placing the device die 20 on the wafer 10, the dielectric layer 20A of the device die 20 is in contact with the dielectric layer 10A of the wafer 10. The device dies 20 are then directly bonded to the wafer 10. The bonding may be achieved through fusion bonding or hybrid bonding. For example, the dielectric layer 20A is bonded to the dielectric layer 10A through fusion bonding. In the embodiments where the bond pads are included in the wafer 10 and the device die 20, the bond pads in the dielectric layer 20A are bonded to bond pads in the dielectric layer 10A through metal-to-metal direct bonding, and the dielectric layer 20A is bonded to the dielectric layer 10A through hybrid bonding. The interface between the dielectric layer 20A and the dielectric layer 10A is bumpless.

To achieve the hybrid bonding, the device dies 20 may be first pre-bonded to the wafer 10 by lightly pressing the device dies 20 against the wafer 10. After all the device dies 20 are pre-bonded, an annealing process is performed to bond the dielectric layers 20A of the device dies 20 to the dielectric layer 10A of the wafer 10. The dielectric layer 20A is bonded to the dielectric layer 10A with bonds formed therebetween. For example, the atoms (such as oxygen atoms) in one of the dielectric layers 20A and 10A form chemical or covalence bonds with the atoms (such as silicon atoms) in the other one of the dielectric layers 20A and 10A. The resulting bonds between the dielectric layers 20A and 10A are dielectric-to-dielectric bonds. In the embodiments where the bond pads are included in the wafer 10 and the device die 20, the anneal is performed to cause the inter-diffusion of the metals in bond pads in the dielectric layer 20A and the corresponding underlying bond pads in the dielectric layer 10A, and the bond pads are bonded through direct metal bonding caused by metal inter-diffusion. The annealing temperature may be in the range between about 200° and about 400° C., and may be in the range between about 300° and about 400° C. in accordance with some embodiments. The annealing time may be in the range between about 1.5 hours and about 3.0 hours, and may be in the range between about 1.5 hours and about 2.5 hours in accordance with some embodiments.

Figure 1C:
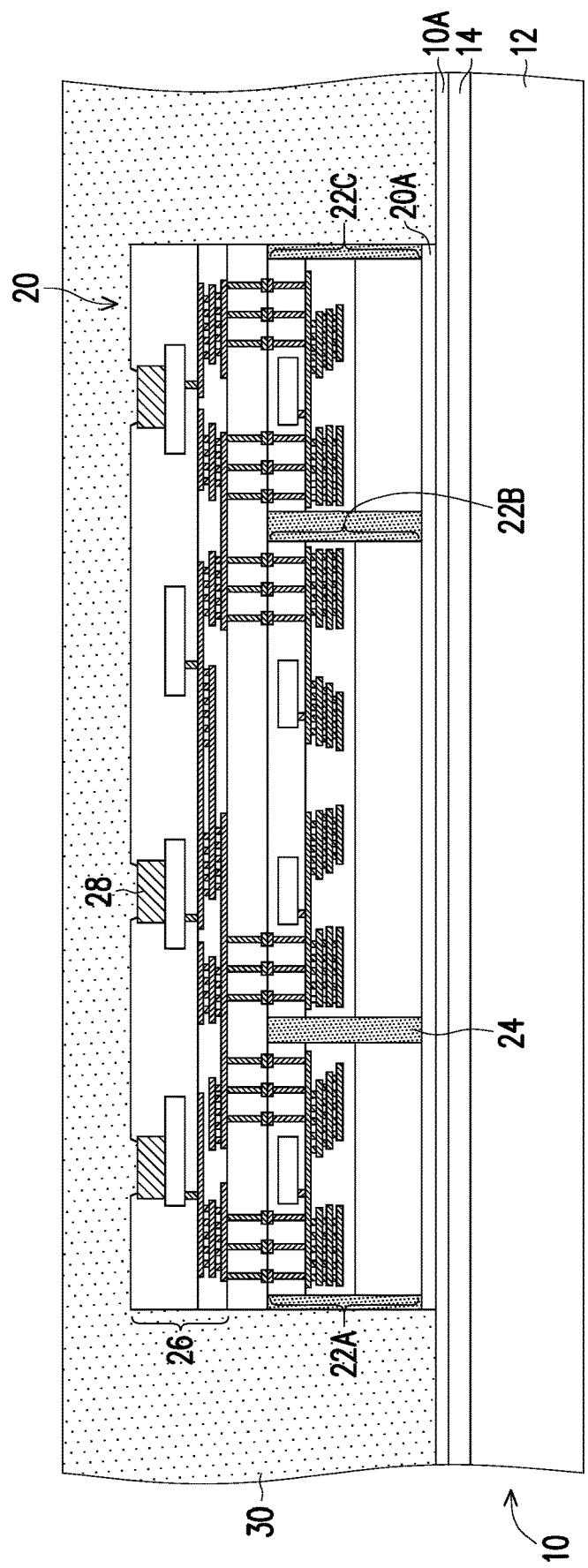

Referring to FIG. 1C, device dies 20 are encapsulated with encapsulating material 30. The encapsulating material 30 may be dispensed and then cured, for example, in a thermal curing process. The encapsulating material 30 may fill the gaps between the device dies 20, and may be in contact with the dielectric layer 10A. The encapsulating material 30 may include a molding compound, a molding underfill, an epoxy, and/or a resin. As shown in FIG. 1C, after the encapsulation process, the top surface of the encapsulating material 30 is higher than the device dies 20.

Figure 1D:
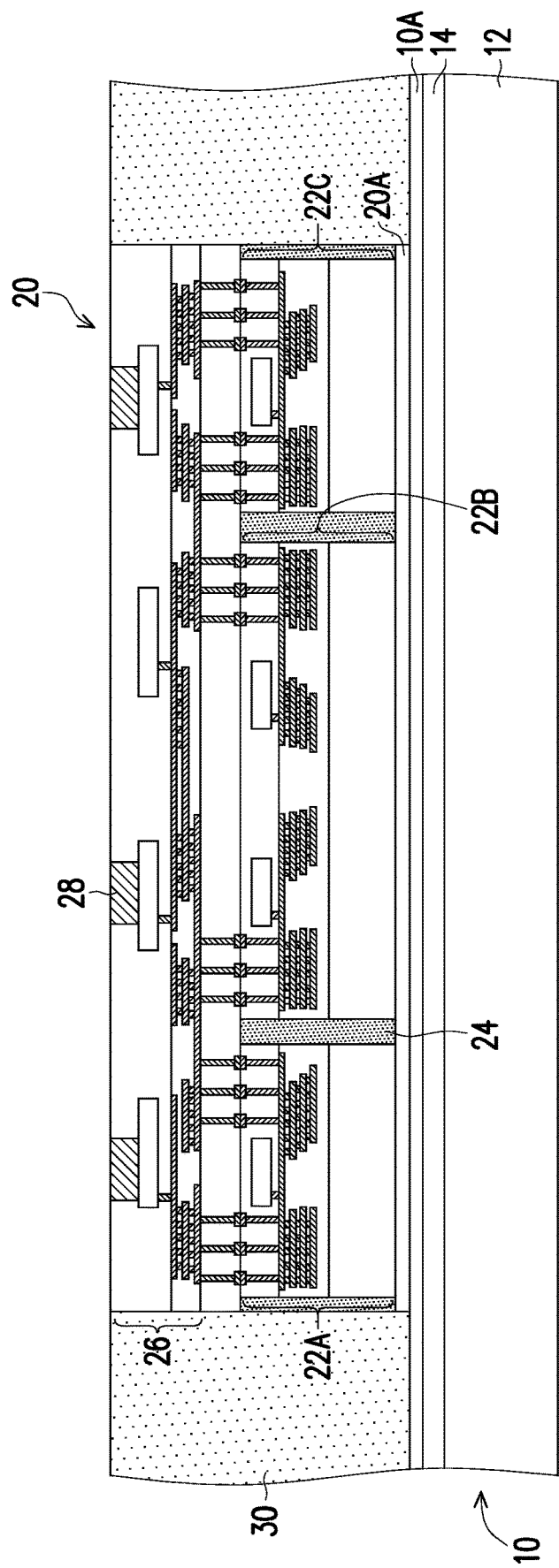

Referring to FIG. 1D, a planarization step such as a Chemical Mechanical Polish (CMP) step or a grinding step is performed to planarize encapsulating material 30, and to expose the conductive features 28. Due to the planarization, the top surfaces of the device dies 20 are substantially level (coplanar) with the top surface of the encapsulating material 30.

Figure 1E:
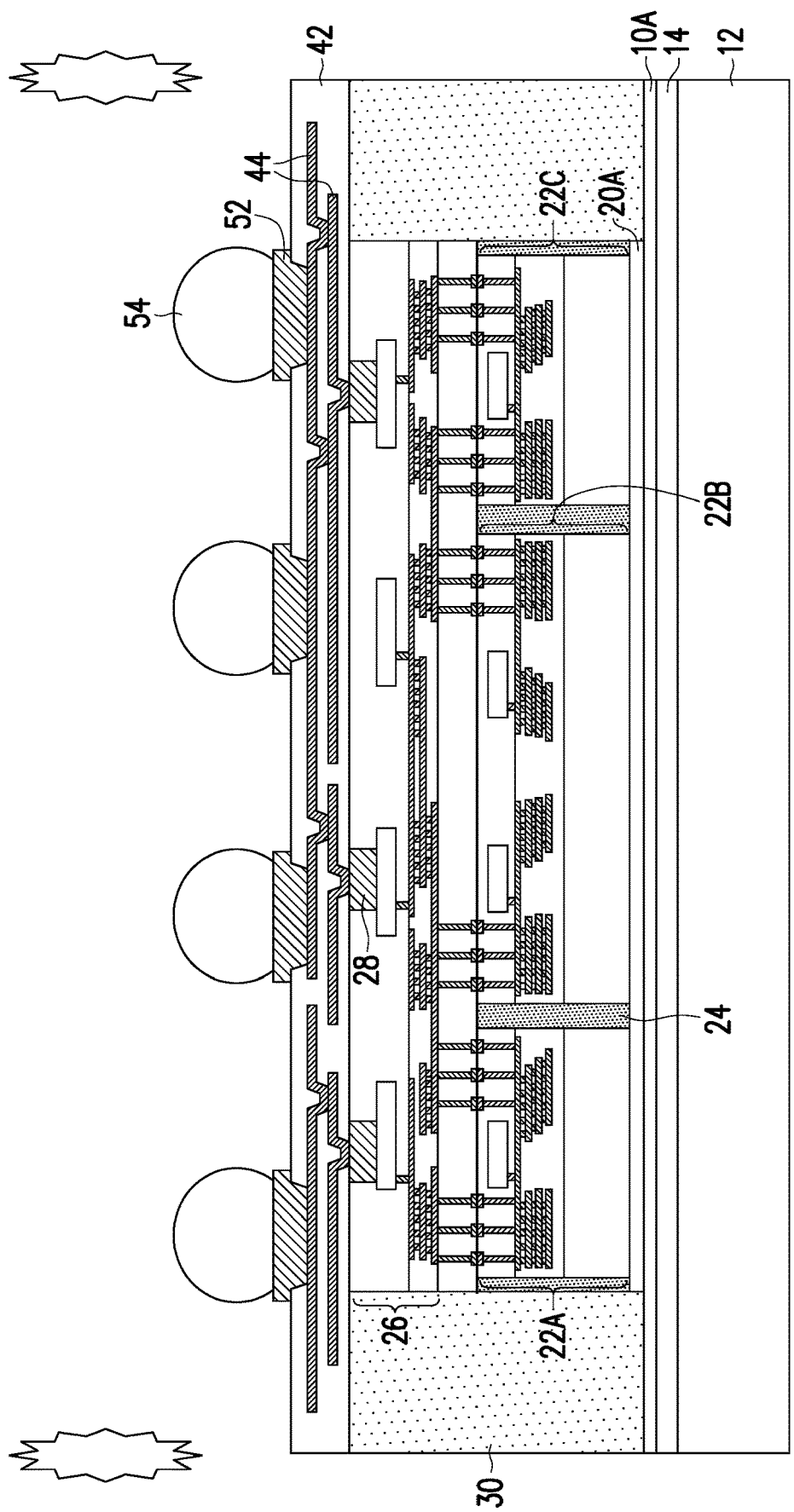

Referring to FIG. 1E, redistribution lines (RDLs) 44 are formed overlapping the encapsulating material 30 and the device dies 20. A dielectric layer 42 may be formed to cover the device dies 20 and the encapsulating material 30. Next, RDLs 44 are formed to penetrate through the dielectric layer 42. More dielectric layers 42 may also be formed. In some embodiments, dielectric layers 42 are formed of a polymer (s) such as PBO, polyimide, or the like. In some alternative embodiments, dielectric layers 42 are formed of an inorganic dielectric material(s) such as silicon nitride, silicon oxide, silicon oxynitride, or the like.

The RDLs 44 are formed to electrically couple to the conductive features 28 in the device dies 20. The RDLs 44 may include metal traces (metal lines) and vias underlying and connected to the respective metal traces. In some embodiments, the RDLs 44 are formed through plating processes, wherein each of the RDLs 44 includes a seed layer (not shown) and a plated metallic material over the seed layer. The seed layer and the plated metallic material may be formed of the same material or different materials. During the formation of the RDLs 44, the dielectric layers 42 are patterned to form via openings (occupied by the RDLs 44), and an upper-level RDLs 44 extend into the via openings to contact an lower-level RDLs 44. In addition, some of the RDLs 44 may be in physical contact with the conductive features 28 in the device dies 20. In some embodiments, the device dies 20 may include through-substrate vias electrically coupled to the wafer 10 and the RDLs 44. In some embodiments, through molding vias may be formed to electrically couple to the wafer 10 and the RDLs 44.

Under-Bump Metallurgies (UBMs) 52 and electrical connectors 54 (such as solder regions) are then formed. The UBMs 52 (or metal pads) are formed to connect to the RDLs 44. The UBMs 52 may include titanium, copper, nickel, or the like. Next, a singulation process may be performed, so that the wafer 10 and the structures formed thereon (e.g. encapsulating material 30) are sawed to form a plurality of packages.

Figure 2:
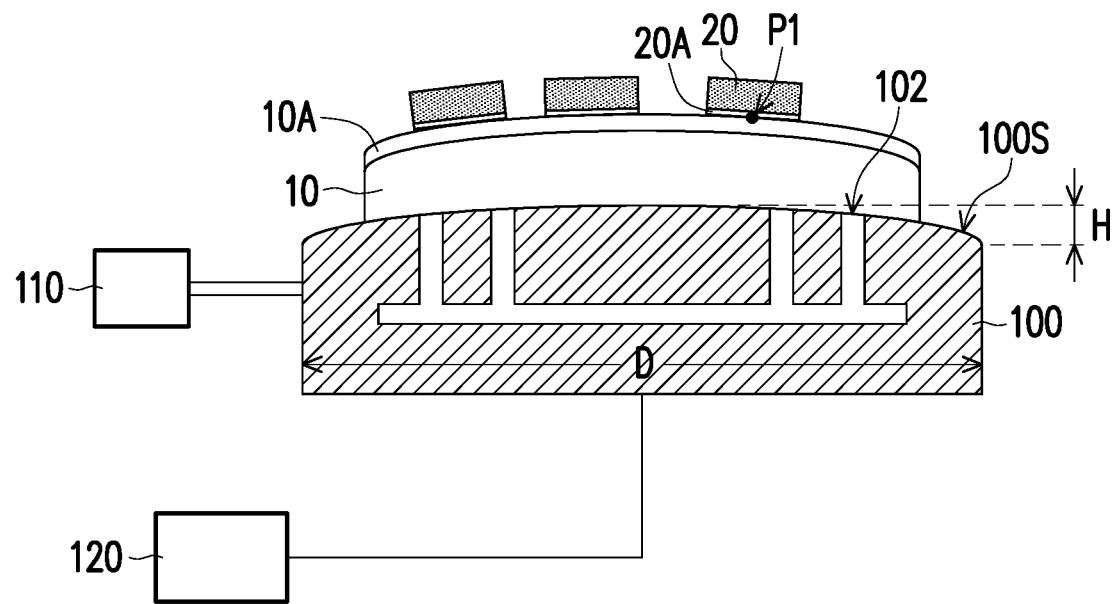
FIG. 2 to FIG. 4 illustrate a schematic cross-sectional view of a wafer chuck and a bonding process to bond device dies to a wafer on the wafer chuck in accordance with some embodiments.

FIG. 2 illustrates a schematic cross-sectional view of a wafer chuck 100. In some embodiments, the wafer chuck 100 may be used during the process shown in FIGS. 1A to 1E. The wafer chuck 100 may have a curved surface 100S. As shown in FIG. 2, the curved surface 100S has a frowning curve profile. In other words, the curved surface 100S has a negative warpage and forms a convex surface. The wafer chuck 100 may include a plurality of openings 102 along the curved surface 100S.

Figure 5:
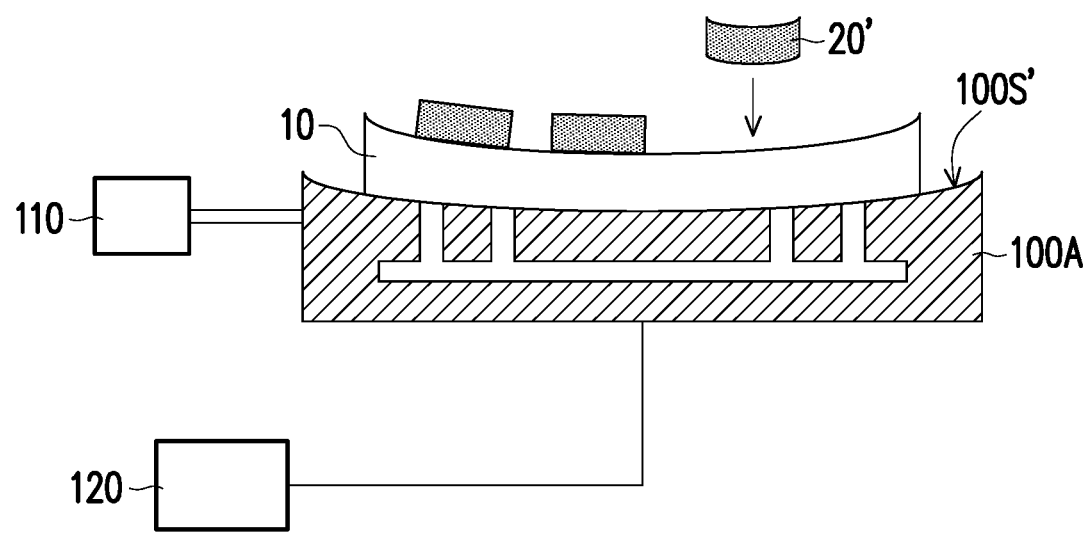
FIG. 5 illustrates a schematic cross-sectional view of a wafer chuck and bonding device dies to a wafer on the wafer chuck in accordance with some embodiments.

The wafer chuck 100 may comprise any suitable material that may be processed to have the openings 102 along the curved surface 100S. In some embodiments, for example, silicon based materials, such as glass, silicon oxide, silicon nitride, or other materials, such as aluminum oxide, combinations of any of these materials, or the like may be used. Additionally, the wafer chuck 100 may have a diameter that is suitable to hold a wafer, for example, the wafer 10 shown in FIG. 2. As such, while the size of the wafer chuck 100 will be in some ways dependent upon the size of the wafer 10, the curved surface 100S may have a diameter D from about 300 mm to about 400 mm. In some alternative embodiments, the curved surface 100S may have a smiling curve profile (as shown in FIG. 5).

In some embodiments, the openings 102 are connected to a vacuum pump 110. During operation, the vacuum pump 110 will evacuate any gases from the openings 102, thereby lowering the pressure within the openings 102. When the wafer 10 is placed against the curved surface 100S and the pressure within the openings 102 has been reduced by the vacuum pump 110, the pressure difference between the side of the wafer facing the openings 102 and the side of the wafer 10 facing away from the openings 102 will hold the wafer 10 at the curved surface 100S. The wafer 10 is thus attached to the wafer chuck 100.

In some embodiments, the curved surface 100S has a frowning curve profile or a smiling curve profile before attaching the wafer 10 onto the curved surface 100S. The pressure difference will warp the wafer 10 into a similarly curved shape as the curved surface 100S. In other words, the curved surface 100S of the wafer chuck 100 may have a curvature in order to induce a warpage in the wafer 10 when the wafer 10 is placed on the wafer chuck 100. The warped wafer 10 may be physically in contact with the curved surface 100S.

A motor 120 may be coupled to the wafer chuck 100. In some embodiments, the motor 120 comprises a piezoelectric motor or a linear motor. Alternatively, the motor 120 may comprise other types of motors. The motor 120 may be adapted to adjust an x position, a y position, a z position, and/or an angular position (θ) of the wafer 10. In some embodiments, the wafer chuck 100 may further comprise a thermal controller (not shown) for thermally controlling the wafer 10.

FIG. 2 also illustrates bonding device dies 20 to a wafer 10 on the wafer chuck 100, as described above with respect to in FIG. 1A to FIG. 1B. Referring to FIGS. 1A, 1B and FIG. 2, the wafer 10 is a placed onto the wafer chuck 100. Optionally, before placing the wafer 10 on the wafer chuck 100, the wafer 10 may be exposed to a plasma process. The plasma process activates the wafer surface and facilitates the bonding process. The plasma process may not be included in the bonding process flow in some embodiments. Once the wafer 10 is in place on the wafer chuck 100, the vacuum pump 110 is initiated, lowering the pressure within the openings 102, holding the wafer 10 to the wafer chuck 100, and warping the wafer 10 into a warped, non-planar shape.

FIG. 2 illustrates an initiating of a bonding process to bond the device dies 20 and the wafer 10. As the discrete device dies 20 are placed on the wafer 10 (e.g. through a pick and place process), the device dies 20 and the pre-warped wafer 10 are brought into contact (thus the dielectric layer 20A of the device die 20 and the dielectric layer of the wafer 10 are brought into contact) at a first point P1. Once in contact, the pre-bonding may start. The contacting may propagate from the first point P1 to the edge of the device die 20. As such, the air between the device die 20 and the wafer 10 may be squeezed out, preventing air bubbles being trapped between the device die 20 and the wafer 10. The air bubble, if trapped, will cause the corresponding parts of the device die and the wafer 10 unable to bond to each other, and will result in yield loss.

In some embodiments, the curved surface 100S may extend away from the remainder of the wafer chuck 100 a height H from about 50 μm to about 1000 μm. As such, the wafer chuck 100 may have the advantage of reducing the number of air bubbles that may be trapped between the device dies and the wafer while remaining desirable bonding condition.

As the pressure is applied to the contacted device dies 20 and the wafer 10, the device dies 20 and the wafer 10 will bond together at each point where the device dies 20 comes into contact with the wafer 10. As shown in FIG. 2, the device die 20 may have a substantially planar bottom surface before the device die 20 is placed on the wafer 10. However, in some alternative embodiments (as shown in FIG. 3 to FIG. 5), the device die 20 may have warpage before being placed on the wafer 10.

Figure 3:
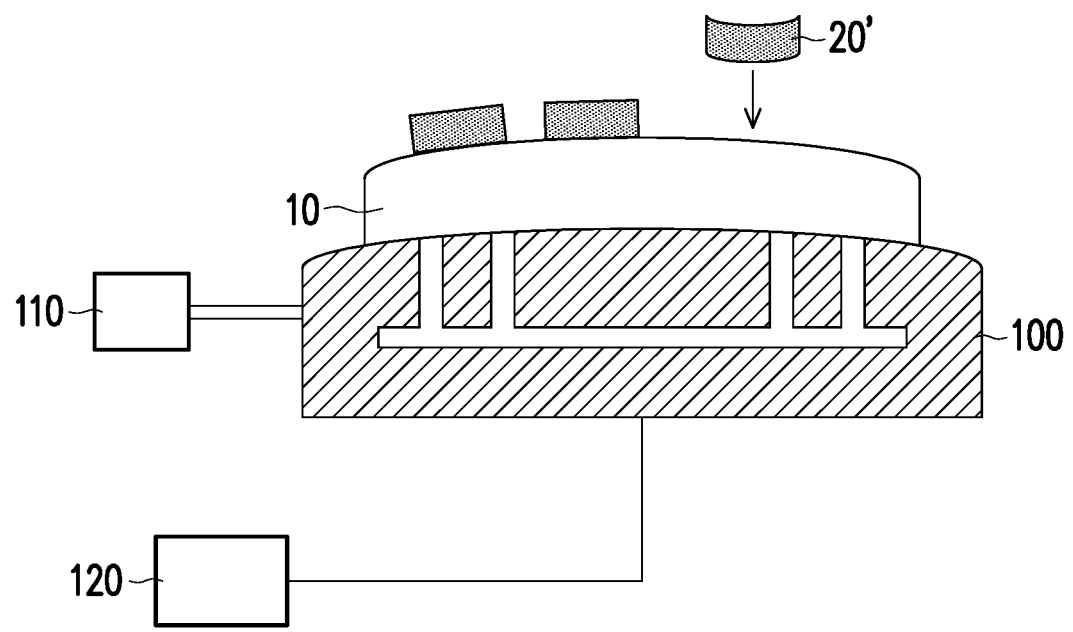

FIG. 3 illustrates a schematic cross-sectional view of a wafer chuck 100 and a bonding process to bond the device dies 20' and the wafer 10 on the wafer chuck 100. The wafer chuck 100, the wafer 10, and the device die 20' in the embodiment shown in FIG. 3 may be similar to the wafer chuck 100, the wafer 10, and the device dies 20 shown in FIG. 2, except that in FIG. 3, the device die 20' has a smiling curve profile before the device die 20' is placed on the wafer 10. In other words, the device die 20' has a positive warpage and is convex downward. However, the warpage of the device die 20' may be changed after the device die 20' and the wafer 10 are bonded.

Figure 4:
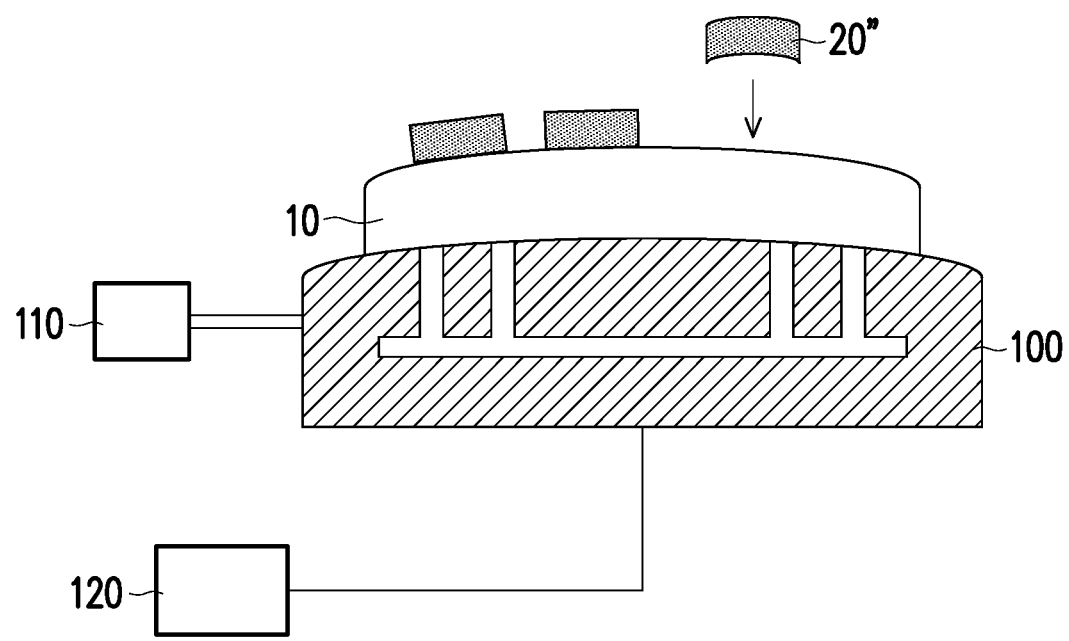

FIG. 4 illustrates a schematic cross-sectional view of a wafer chuck 100 and a bonding process to bond the device dies 20" and the wafer 10 on the wafer chuck 100. The wafer chuck 100, the wafer 10, and the device die 20" in the embodiment shown in FIG. 4 may be similar to the wafer chuck 100, the wafer 10, and the device dies 20 shown in FIG. 2, except that in FIG. 4, the device die 20" has a frowning curve profile before the device die 20" is placed on the wafer 10. In other words, the device die 20" has a negative warpage and is convex upward. However, the warpage of the device die 20" may be changed after the device die 20" and the wafer 10 are bonded.

FIG. 5 illustrates a schematic cross-sectional view of a wafer chuck 100A and a bonding process to bond the device dies 20' and the wafer 10 on the wafer chuck 100A. The wafer chuck 100A, the wafer 10, and the device dies 20' in the embodiment shown in FIG. 5 may be similar to the wafer chuck 100, the wafer 10, and the device dies 20' shown in FIG. 3, except that in FIG. 5, a curved surface 100S' of the wafer chuck 100A has a smiling curve profile. In other words, the curved surface 100S' has a positive warpage and forms a concave surface. Similar to the embodiment shown in FIG. 3, in FIG. 5, the device die 20' has a smiling curve profile before the device die 20' is placed on the wafer 10. In some embodiments, selecting a wafer chuck having suitable warpage condition (such as positive warpage or negative warpage) based on the warpage condition of the device dies to be bonded, such that the device die and the wafer on the wafer chuck may be contacted at a point at first, may reduce the number of air bubbles that may be trapped between the device dies and the wafer.

Figure 6A:
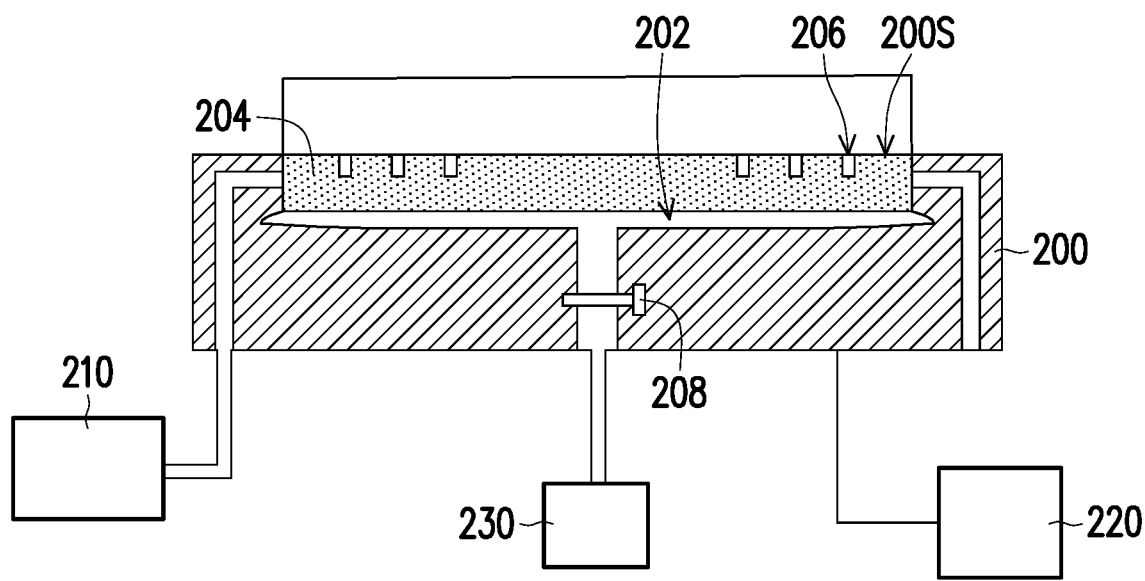
FIGS. 6A and 6B illustrate cross-sectional views of a wafer chuck in accordance with some embodiments.
Figure 6B:
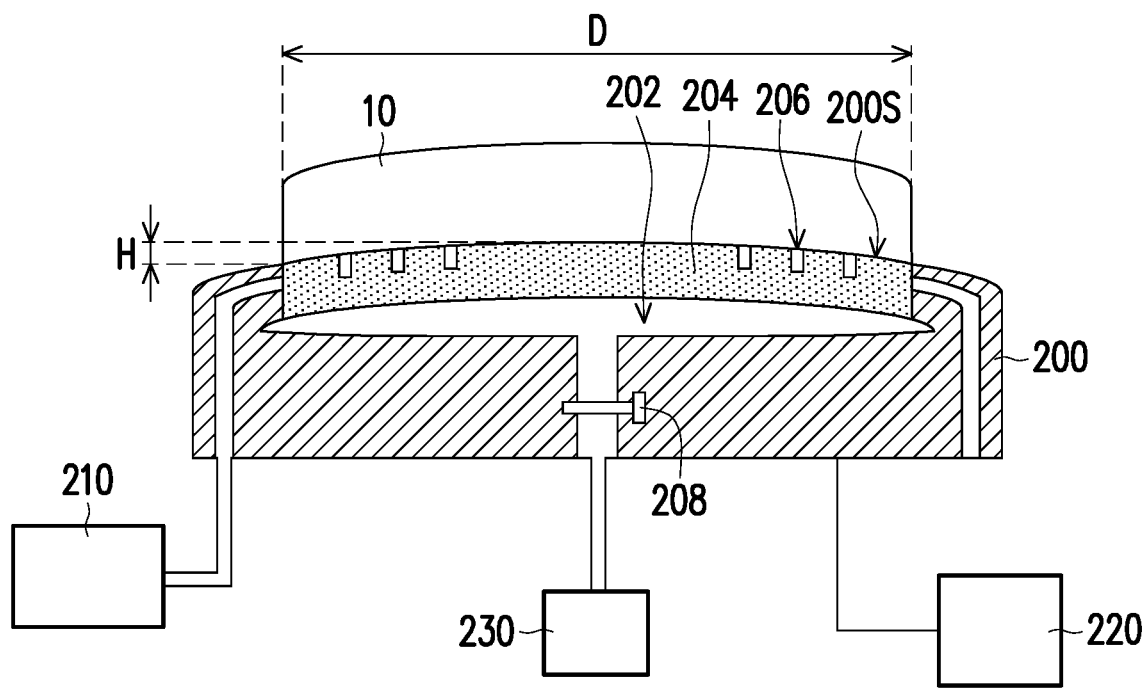

FIGS. 6A and 6B illustrates a cross-sectional view of a wafer chuck 200 and a wafer 10. In some embodiments, the wafer chuck 200 is used during the process shown in FIGS. 1A to 1E, for example, bonding device dies to a wafer, as described above with respect to in FIG. 1A to FIG. 1B. Referring to FIGS. 6A and 6B, the wafer chuck 200 comprises a fluid chamber 202 and a flexible material layer 204 over the fluid chamber 202. In some embodiments, the fluid chamber 202 may comprise any suitable material, for example, silicon based materials, such as glass, silicon oxide, silicon nitride, or other materials, such as aluminum oxide, combinations of any of these materials, or the like.

The flexible material layer 204 may have openings 206 on a surface 200S of the flexible material layer 204 facing away from the fluid chamber 202. In some embodiments, the openings 206 are connected to a vacuum pump 210. The openings 206 and the vacuum pump 210 may function similarly as the vacuum pump 110 and the openings 102 illustrated in FIG. 2. For example, once the wafer 10 is in place on the wafer chuck 200, the vacuum pump 210 is initiated, lowering the pressure within the openings 206, holding the wafer 10 to the wafer chuck 200, and warping the wafer 10 into a warped, non-planar shape.

Accordingly, the profile of the wafer 10 conforms to the profile of the flexible material layer 204. The flexible material layer 204 may have a diameter that is suitable to hold the wafer 10, and the diameter of the flexible material layer 204 may vary according to a diameter of the wafer 10. In some embodiments, the diameter D of the flexible material layer 204 may be from about 300 mm to about 400 mm. The flexible material layer 204 may comprise materials having sufficient flexibility and capable of being processed to have openings 206 along the surface 200S, such as, for example, plastic, polymer, metal, polymer-coated metal, or the like.

In some embodiments, the fluid chamber 202 may be connected to a second pump 230. The second pump 230 may be configured to fill a fluid into the fluid chamber 202 or extract the fluid out of the fluid chamber 202. The wafer chuck 200 may further include a pressure valve 208 for controlling the pressure in the fluid chamber 202. Through the functioning of the second pump 230, the pressure in the fluid chamber 202 may be controlled to be larger or smaller than the ambient pressure, such that the flexible material layer 204 may be deformed due to the pressure difference. As such, the profile of the surface 200S may be set by adjusting the pressure in the fluid chamber 202. As shown in FIG. 6B, the surface 200S may have a frowning curve profile after adjusting the pressure in the fluid chamber. In some alternative embodiments, the surface 200S may have a smiling curve profile after adjusting the pressure in the fluid chamber.

The surface 200S may be set into profiles with various warpage condition through adjustment of the pressure in the fluid chamber 202. For example, as shown in FIG. 6A, the fluid chamber is under a first pressure and the surface 200S has a first curvature, while in FIG. 6B, the fluid chamber is under a second pressure different from the first pressure, such that the surface 200S has a second curvature different from the first curvature. Therefore, the profile of the surface 200S of the wafer chuck 200 may be adjustable according to actual needs. In some embodiments, the surface 200S may have a height H from about 50 μm to about 1000 μm. The wafer chuck 200 may further include a motor 220 similar to the motor 120 shown in FIG. 2.

Figure 7:
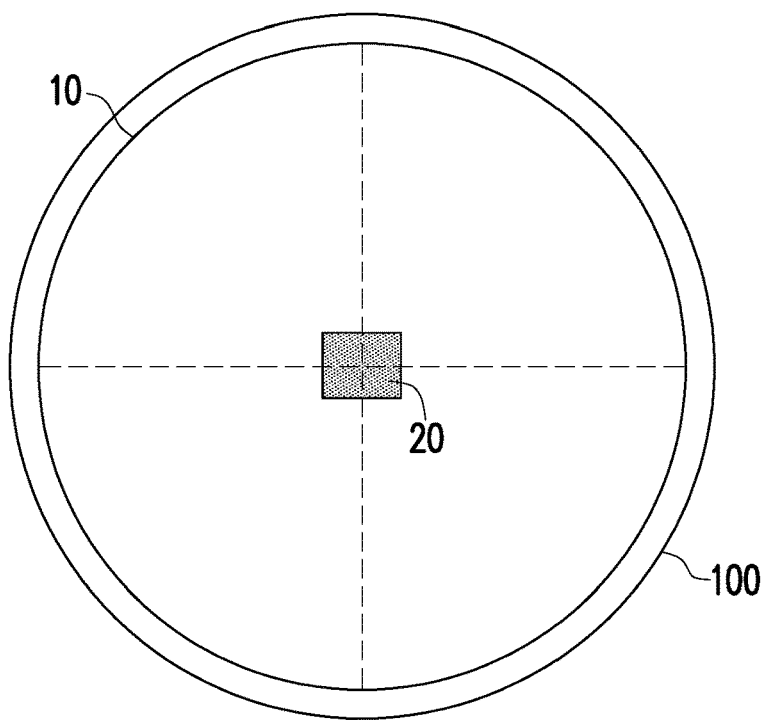
FIGS. 7 and 8 are top views illustrating bonding a device die to a wafer in accordance with some embodiments.
Figure 8:
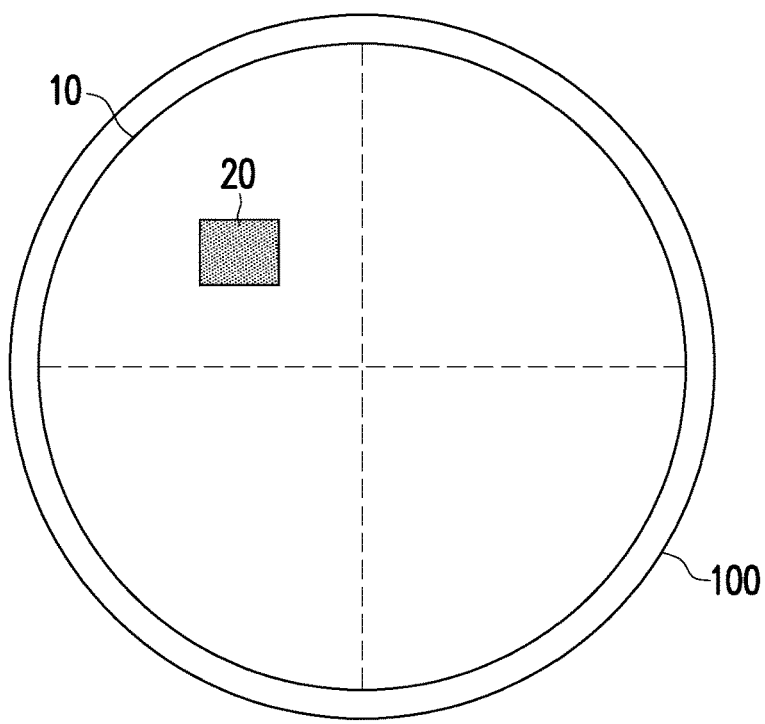

FIGS. 7 and 8 are top views illustrating bonding a device die to a wafer in accordance with some embodiments. FIGS. 7 and 8 are top views of a wafer chuck 100, a wafer 10, and a device dies 20 similar to a top view of the wafer chuck 100, the wafer and the device dies 20 in the embodiment shown in FIG. 2. Referring to FIGS. 7 and 8, the wafer 10 is attached to the wafer chuck 100 and may be warped by the wafer chuck 100. Thus, the wafer 10 may have a frowning curve profile. A device die 20 is bonded to the wafer 10, for example, through fusion bonding or hybrid bonding. In some embodiments, as shown in FIG. 7, the discrete device die 20 may be placed at the center of the wafer 10 and then be bonded to the wafer 10. As such, the device die 20 may be placed on the apex of the warped wafer 10. In some alternative embodiments, as shown in FIG. 8, the discrete device die 20 may not be placed at the center of the wafer 10. The device die 20 may be placed at any position on the wafer 10 and bonded to the wafer 10. Although one device die 20 is illustrated in FIGS. 7 and 8, multiple discrete device dies 20 may be placed and bonded to the wafer 10.

In the present disclosure, device dies (such as a SOIC) are bonded to a wafer and are integrated into a package. In accordance with some embodiments of the present disclosure, attaching the wafer to a wafer chuck having a curved surface before placing the device dies to be bonded on the wafer may reduce the number of air bubbles that may be trapped between the device dies and the wafer. The yield of the resulting package may be improved.

In accordance with some embodiments of the present disclosure, a method includes attaching a wafer to a wafer chuck having a curved surface; placing a device die on the wafer, such that a first dielectric layer of the device die is in contact with a second dielectric layer of the wafer; performing an annealing process to bond the first dielectric layer to the second dielectric layer; encapsulating the device die with an encapsulating material; forming redistribution lines overlapping the encapsulating material and the device die; and sawing the encapsulating material to form a plurality of packages. In an embodiment, the curved surface of the wafer chuck has a frowning curve profile. In an embodiment, the device die has a smiling curve profile before placing the device die on the wafer. In an embodiment, the device die has a substantially planar bottom surface before placing the device die on the wafer. In an embodiment, the device die has a frowning curve profile before placing the device die on the wafer. In an embodiment, the curved surface of the wafer chuck has a smiling curve profile. In an embodiment, the device die has a smiling curve profile before placing the device die on the wafer. In an embodiment, placing the device die on the wafer comprises performing a pick and place process. In an embodiment, the device die includes stacked dies.

In accordance with some embodiments of the present disclosure, a method includes attaching a wafer onto a curved surface of a wafer chuck, such that the wafer is warped and physically in contact with the curved surface; picking and placing discrete device dies to the wafer, each of the device dies comprising a first dielectric layer, such that the first dielectric layers of the device dies are in contact with a second dielectric layer of the wafer; performing an annealing process to bond the first dielectric layers of the device dies to the second dielectric layer; encapsulating the device dies with an encapsulating material; and forming redistribution lines overlapping the encapsulating material and the device dies. In an embodiment, the curved surface has a height from about 50 μm to about 1000 μm and a diameter from about 300 mm to about 400 mm. In an embodiment, an interface between the first dielectric layer and the second dielectric layer is bumpless. In an embodiment, placing each of the device die on the wafer comprises firstly bringing the first dielectric layer of the device die and the second dielectric layer of the wafer into contact at a first point. In an embodiment, the curved surface has a frowning curve profile or a smiling curve profile before attaching the wafer onto the curved surface.

In accordance with some embodiments of the present disclosure, a method includes providing a wafer chuck comprising a fluid chamber and a flexible material layer over the fluid chamber; adjusting a pressure in the fluid chamber to set a profile of a surface of the wafer chuck; placing a wafer on the wafer chuck, the wafer being held at the surface of the wafer chuck; placing discrete device dies on the wafer; directly bonding each of the device dies to the wafer; encapsulating each of the device dies with an encapsulating material. In an embodiment, the surface of the wafer chuck has a frowning curve profile or a smiling curve profile after adjusting the pressure in the fluid chamber. In an embodiment, the surface of the wafer chuck has a first curvature when the fluid chamber is under a first pressure, and the surface of the wafer chuck has a second curvature different from the first curvature when the fluid chamber is under a second pressure different from the first pressure. In an embodiment, the surface has a height from about 50 µm to about 1000 µm and a diameter from about 300 mm to about 400 mm. In an embodiment, the flexible material layer comprises openings along the surface, and the openings are connected to a first pump. In an embodiment, the fluid chamber is connected to a second pump.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   attaching a wafer to a wafer chuck having an adjustable curved surface, wherein the adjustable curved surface is adjusted when the wafer is attached to the wafer chuck, and a profile of the adjustable curved surface is selected from profiles with various warpage conditions;
   placing a device die on the wafer, such that a first dielectric layer of the device die is in contact with a second dielectric layer of the wafer;
   performing an annealing process to bond the first dielectric layer to the second dielectric layer;
   encapsulating the device die with an encapsulating material;
   forming redistribution lines overlapping the encapsulating material and the device die; and
   sawing the encapsulating material to form a plurality of packages.

2. The method of claim 1, wherein the adjustable curved surface of the wafer chuck has a frowning curve profile.

3. The method of claim 2, wherein the device die has a smiling curve profile before placing the device die on the wafer.

4. The method of claim 2, wherein the device die has a substantially planar bottom surface before placing the device die on the wafer.

5. The method of claim 2, wherein the device die has a frowning curve profile before placing the device die on the wafer.

6. The method of claim 1, wherein the adjustable curved surface of the wafer chuck has a smiling curve profile.

7. The method of claim 6, wherein the device die has a smiling curve profile before placing the device die on the wafer.

8. The method of claim 1, wherein placing the device die on the wafer comprises performing a pick and place process.

9. The method of claim 1, wherein the device die includes stacked dies.

10. A method comprising:
    adjusting an adjustable curved surface of a wafer chuck such that a profile of the adjustable curved surface is set to a warpage condition, wherein the adjustable curved surface is adjusted when the wafer is attached to the wafer chuck;
    attaching a wafer onto the adjustable curved surface of the wafer chuck, such that the wafer is warped and physically in contact with the adjustable curved surface;
    picking and placing discrete device dies to the wafer, each of the device dies comprising a first dielectric layer, such that the first dielectric layers of the device dies are in contact with a second dielectric layer of the wafer;
    performing an annealing process to bond the first dielectric layers of the device dies to the second dielectric layer;
    encapsulating the device dies with an encapsulating material; and
    forming redistribution lines overlapping the encapsulating material and the device dies.

11. The method of claim 10, wherein the adjustable curved surface has a height from about 50 µm to about 1000 µm and a diameter from about 300 mm to about 400 mm.

12. The method of claim 10, wherein an interface between the first dielectric layer and the second dielectric layer is bumpless.

13. The method of claim 10, wherein placing each of the device die on the wafer comprises firstly bringing the first dielectric layer of the device die and the second dielectric layer of the wafer into contact at a first point.

14. The method of claim 10, wherein the adjustable curved surface has a frowning curve profile or a smiling curve profile before attaching the wafer onto the adjustable curved surface.

15. A method comprising:
    providing a wafer chuck comprising a fluid chamber and a flexible material layer over the fluid chamber;
    adjusting a pressure in the fluid chamber to set a profile of an adjustable surface of the wafer chuck;
    placing a wafer on the wafer chuck, the wafer being held at the adjustable surface of the wafer chuck, wherein the adjustable surface is adjusted when the wafer is placed on the wafer chuck;
    placing discrete device dies on the wafer;
    directly bonding each of the device dies to the wafer;
    encapsulating each of the device dies with an encapsulating material.

16. The method of claim 15, wherein the adjustable surface of the wafer chuck has a frowning curve profile or a smiling curve profile after adjusting the pressure in the fluid chamber.

17. The method of claim 15, wherein the adjustable surface of the wafer chuck has a first curvature when the fluid chamber is under a first pressure, and the adjustable surface of the wafer chuck has a second curvature different from the first curvature when the fluid chamber is under a second pressure different from the first pressure.

18. The method of claim 15, wherein the adjustable surface has a height from about 50 µm to about 1000 µm and a diameter from about 300 mm to about 400 mm.

19. The method of claim 15, wherein the flexible material layer comprises openings along the adjustable surface, and the openings are connected to a first pump.

20. The method of claim 15, wherein the fluid chamber is connected to a second pump.

* * * * *